(12) United States Patent
Madurawe (10) Patent No.: US 7,064,018 B2
(45) Date of Patent: Jun. 20, 2006

(54) METHODS FOR FABRICATING THREE DIMENSIONAL INTEGRATED CIRCUITS

(75) Inventor: Raminda Udaya Madurawe, Sunnyvale, CA (US)

(73) Assignee: Viciciv Technology, Sunnyvale, CA (US)

(*) Notice: Subject to any disclaimer, the term of this patent is extended or adjusted under 35 U.S.C. 154(b) by 52 days.

(21) Appl. No.: 10/846,698

(22) Filed: May 17, 2004

(65) Prior Publication Data

US 2004/0214387 A1   Oct. 28, 2004

Related U.S. Application Data

(63) Continuation of application No. 10/267,484, filed on Oct. 8, 2002, now abandoned.

(60) Provisional application No. 60/393,763, filed on Jul. 8, 2002, provisional application No. 60/397,070, filed on Jul. 22, 2002.

(51) Int. Cl.
*H01L 21/84* (2006.01)
*H01L 21/00* (2006.01)

(52) U.S. Cl. ............... 438/149; 438/152; 438/165; 438/200

(58) Field of Classification Search ........... 438/149, 438/200, 152, 165
See application file for complete search history.

(56) References Cited

U.S. PATENT DOCUMENTS

| | | | |
|---|---|---|---|
| 5,563,526 A | 10/1996 | Hastings et al. | |
| 5,581,501 A | 12/1996 | Sansbury et al. | |
| 5,625,221 A | 4/1997 | Kim et al. | |
| 5,679,967 A | 10/1997 | Janai et al. | |
| 5,835,405 A | 11/1998 | Tsui et al. | |
| 5,844,422 A | 12/1998 | Trimberger et al. | |
| 5,943,574 A | 8/1999 | Tehrani et al. | |
| 5,949,710 A | 9/1999 | Pass et al. | |
| 6,018,476 A | 1/2000 | Madurawe et al. | |
| 6,097,211 A | 8/2000 | Couts-Martin et al. | |
| 6,121,961 A * | 9/2000 | Feldman | 345/204 |
| 6,134,173 A | 10/2000 | Cliff et al. | |
| 6,242,767 B1 | 6/2001 | How et al. | |
| 6,331,784 B1 | 12/2001 | Mason et al. | |
| 6,331,789 B1 | 12/2001 | Or-Bach | |
| 6,448,808 B1 | 9/2002 | Young et al. | |
| 6,504,742 B1 | 1/2003 | Tran et al. | |
| 6,515,511 B1 | 2/2003 | Sugibayashi et al. | |
| 6,569,717 B1 * | 5/2003 | Murade | 438/149 |
| 6,582,980 B1 | 6/2003 | Feldman et al. | |
| 6,613,611 B1 | 9/2003 | How et al. | |
| 6,627,985 B1 | 9/2003 | Huppenthal et al. | |
| 2001/0003428 A1 | 6/2001 | Or-Bach | |
| 2001/0047509 A1 | 11/2001 | Mason et al. | |
| 2003/0023762 A1 | 1/2003 | Dhir et al. | |

OTHER PUBLICATIONS

Ashok K. Sharma, "Programmable Logic Handbook—PLDs, CPLDs, & FPGAs", 1998, pp. 99-171, McGraw-Hill, USA.

* cited by examiner

*Primary Examiner*—George Fourson
*Assistant Examiner*—Fernando L. Toledo (57) ABSTRACT

A method of forming a semiconductor device includes fabricating digital circuits comprising a programmable logic circuit on a substrate; selectively fabricating either a memory circuit or a conductive pattern substantially above the digital circuits to program said programmable logic circuit; and fabricating a common interconnect and routing layer substantially above the digital circuits and memory circuits to connect digital circuits and one of the memory circuit or the conductive pattern.

4 Claims, 8 Drawing Sheets

METHODS FOR FABRICATING THREE DIMENSIONAL INTEGRATED CIRCUITS

This application is a continuation of application Ser. No. 10/267,484 filed on Oct 8, 2002, which claims priority from Provisional Application Ser. No. 60/393,763 entitled "Wire Replaceable TFT SRAM Cell and Cell Array Technology", filed on Jul. 8, 2002 and Provisional Application Ser. No. 60/397,070 entitled "Wire Replaceable Thin Film Fuse and Anti-fuse Technology", filed on Jul. 22, 2002, all of which have as inventor Mr. R. U. Madurawe and the contents of which are incorporated-by-reference.

This application is also related to application Ser. No. 10/267,483 entitled "Three-Dimensional Integrated Circuits" and application Ser. No. 10/267,511 entitled "Field Programmable Gate Array With Convertibility to Application Specific Integrated Circuit", all of which were filed on Oct. 8, 2002 and list as inventor Mr. R. U. Madurawe, the contents of which are incorporated-by-reference.

BACKGROUND

The present invention relates to methods for making multi-dimensional integrated circuits.

Integrated electronic circuits (ICs) are usually fabricated with pre-specified devices and internal connections which are implemented during the manufacturing process. Moreover, once a fabrication process is specified for a particular IC, the process typically is not substantially altered unless major processing errors are identified Any changes to the particular IC design have no accompanying changes to the fabrication process. This methodology is followed in custom, or semi-custom application specific integrated circuit (ASIC) devices used in high volume, low cost applications.

The design and fabrication of custom or semi-custom ICs can be time consuming and expensive. The customization involves a lengthy design cycle during the product definition phase and high Non Recurring Engineering (NRE) costs during the manufacturing phase. Further, should errors exist in the custom or semi-custom ICs, the design/fabrication cycle has to be repeated, further aggravating the time to market and engineering cost As a result, ASICs serve only specific markets and are custom built for high volume and low cost applications.

Another type of semi custom device called a Gate Array customizes modular blocks at a reduced NRE cost by synthesizing the design using a software model similar to the ASIC. The missing silicon level design verification results in multiple spins and lengthy design iterations.

In recent years there has been a move away from custom or semi-custom ICs towards field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to optimize silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional ASIC approaches, but the volumes are unpredictable during early stages of the product life cycle. However, the conversion from an FPGA implementation to an ASIC implementation typically requires a complete redesign. Such redesign is undesirable in that the FPGA design effort is wasted.

Compared to PLD and FPGA, an ASIC has hard-wired logic connections, identified during the chip design phase, and need no configuration memory cells. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage).

There is no convenient migration path from a PLD or FPGA used as a design verification and prototyping vehicle to the lower die size ASIC. All of the SRAM or Anti-fuse configuration bits and programming circuitry has no value to the ASIC. Programmable module removal from the PLD or FPGA and the ensuing layout and design customization is time consuming with severe timing variations from the original design.

SUMMARY

In one aspect, a method of forming a semiconductor device includes fabricating one or more digital circuits on a substrate; selectively fabricating either a memory circuit or a conductive pattern substantially above the digital circuits to control portion of digital circuits; and fabricating an interconnect and routing layer substantially above the digital circuits and memory circuits to connect digital circuits and one of the memory circuit or the conductive pattern.

Implementations of the above method may include one of the following. The fabricating of digital circuits may include fabricating logic blocks. The memory circuit may contain programmable memory to configure logic blocks to a user specification. The conductive pattern may contain hard-wired controls to configure logic blocks. A generic field programmable gate array (FPGA) may be formed with the constructed memory circuit, while an application specific integrated circuit (ASIC) may be formed with the constructed conductive pattern Multiple ASICs with different variations of conductive patterns may be fabricated. The memory circuit and the conductive pattern have one or more substantially matching logic control characteristics. One of the circuit characteristics includes timing characteristics substantially unchanged by the circuit control option. Data stored in the memory circuit may be mapped to the conductive pattern. A custom mask corresponding to the conductive pattern may be generated to fabricate an ASIC. The memory circuit may include a thin-film transistor (TFT). A TFT process sequence may be inserted into a logic process flow to add the memory module. The logic process sequence may be forming a P-type substrate; creating a twin well; developing a shallow trench isolation; performing a sacrificial oxide; generating a PMOS threshold (Vt) mask and implant; generating a NMOS Vt mask and implant; developing gate oxidation; depositing gate poly (GP); applying the GP mask and etch; applying an LDN mask and implant; applying an LDP mask and implant; depositing a spacer oxide and etching the spacer oxide; depositing Nickel; performing RTA anneal—Ni salicidation (S/DIG regions & interconnect); etching to remove unreacted Nickel; depositing ILD oxide and performing CMP; applying a C1 mask and etch; forming a W plug and performing CMP; depositing M1; applying an M1 mask & etch; and performing back end metallization. The TFT process sequence may additionally include depositing amorphous poly-1 (P1); performing P1 mask & etch; applying NMOS Vt mask & P− implant; applying PMOS Vt mask & N− implant; depositing Gox; applying buried contact mask & etch; depositing amorphous poly-2 (P2); applying P2 mask & etch; applying LDN mask & N− implant; applying LDP mask & P− implant; depositing a spacer oxide and etching the spacer oxide; exposing P1 and P2 regions for salicidation; applying N+ mask & implanting NMOS G/S/D; applying P+ mask & implanting PMOS G/S/D; depositing Nickel; salicidizing the Nickel using RTA on the G/S/D regions & interconnect; using the RTA anneal to recrystallize P1 regions under P2 gates; depositing ILD oxide & CMP; applying C2 mask & etch; and forming a W plug & CMP. In one embodiment, the TFT process sequence is inserted to the logic sequence prior to depositing M1 step. In another embodiment, the TFT process sequence is inserted to the logic sequence prior to depositing MN step, where MN is any higher metal layer.

In another aspect, a method of forming a semiconductor device includes fabricating digital circuits on a first plane; selectively fabricating either a memory circuit or a conductive pattern on a second plane to control a portion of the digital circuits; and fabricating an interconnect and routing layer in a third plane above the first and second planes to connect digital circuits and either memory circuits or conductive patterns.

Implementations of this aspect may include fabricating a field programmable gate array (FPGA) with the memory circuit or an application specific integrated circuit (ASIC) with the conductive pattern. The memory circuit and the conductive pattern have one or more substantially matching logic control characteristics such that the timing characteristics of the FPGA and ASIC are substantially unchanged by the circuit control option.

In yet another aspect, a method to fabricate a programmable logic device includes constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern options have substantially matching timing characteristics.

In yet another aspect, a method of forming a semiconductor device includes fabricating digital circuits on a first plane; selectively fabricating either a configuration circuits or a conductive pattern on a second plane to control a portion of the digital circuits; and fabricating an interconnect and routing layer in a third plane above the first and second planes to connect the digital circuits and either the configuration circuit or the conductive pattern.

The result of the process/method is a three-dimensional semiconductor device includes a first module layer having a plurality of circuit blocks; and a second module layer formed substantially above the first module layer, wherein a plurality of configuration circuits are formed to store instructions to control a portion of the circuit modules. The configuration circuits can be memory elements. Each memory element can be a transistor or a diode. The memory elements can be thin film devices such as thin film transistors (TFT) or diodes. The memory element can be selected from the group consisting of volatile or non volatile memory elements. The memory element can also be selected from the group of fuses, antifuses, SRAM cells, DRAM cells, metal optional links, EPROMs, EEPROMS, flash, and ferro-electric elements. One or more redundant memory cells can be provided for controlling the same circuit block A third module layer can be formed substantially above the first and second module layer, wherein interconnect and routing signals are formed to connect the circuit modules within the first and second module layers. The third module layer can be formed substantially below the first and second module layer. Alternatively, third and fourth module layers can be positioned above and below the second module layer respectively. The circuit module can be a programmable logic blocks which responds to input data signals and develops corresponding complete or partial output logic signals, and registers to store the logic signals and either outputting them to output terminals or returning them as inputs to additional programmable logic blocks. The programmable logic block can be a pass gate logic, a multiplexer, a truth table logic, or an AND/OR logic.

Advantages of the methods may include one or more of the following. An easy turnkey customization of an ASIC from an original smaller PLD or FPGA would greatly enhance time to market, low cost and better reliability. The IC product is re-programmable in its initial FPGA stage providing time to market and early prototyping advantages. The IC product is a low cost ASIC with substantially matching timing and low NRE costs when the volumes grow. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks. A series product families can be provided with a modularized programmable element in an FPGA version followed by a turnkey custom ASIC with the same base die with 1–2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASICs in cost.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art The term conductor is understood to include semiconductors, and the term insulator is defined to include any material that is less electrically conductive than the materials referred to as conductors. The following detailed description is, therefore, not to be taken in a limiting sense.

The term module layer includes a structure that is fabricated using a series of predetermined process steps. The boundary of the structure is defined by a first step, one or more intermediate steps, and a final step. The resulting structure is formed on a substrate.

The term configuration circuit includes one or more configurable elements and connections that can be programmed for controlling one or more circuit blocks in accordance with a predetermined user-desired functionality. In one embodiment, the configuration circuits include a plurality of memory circuits to store instructions to configure an FPGA. In another embodiment, the configuration circuits include a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate.

Figure 1A:
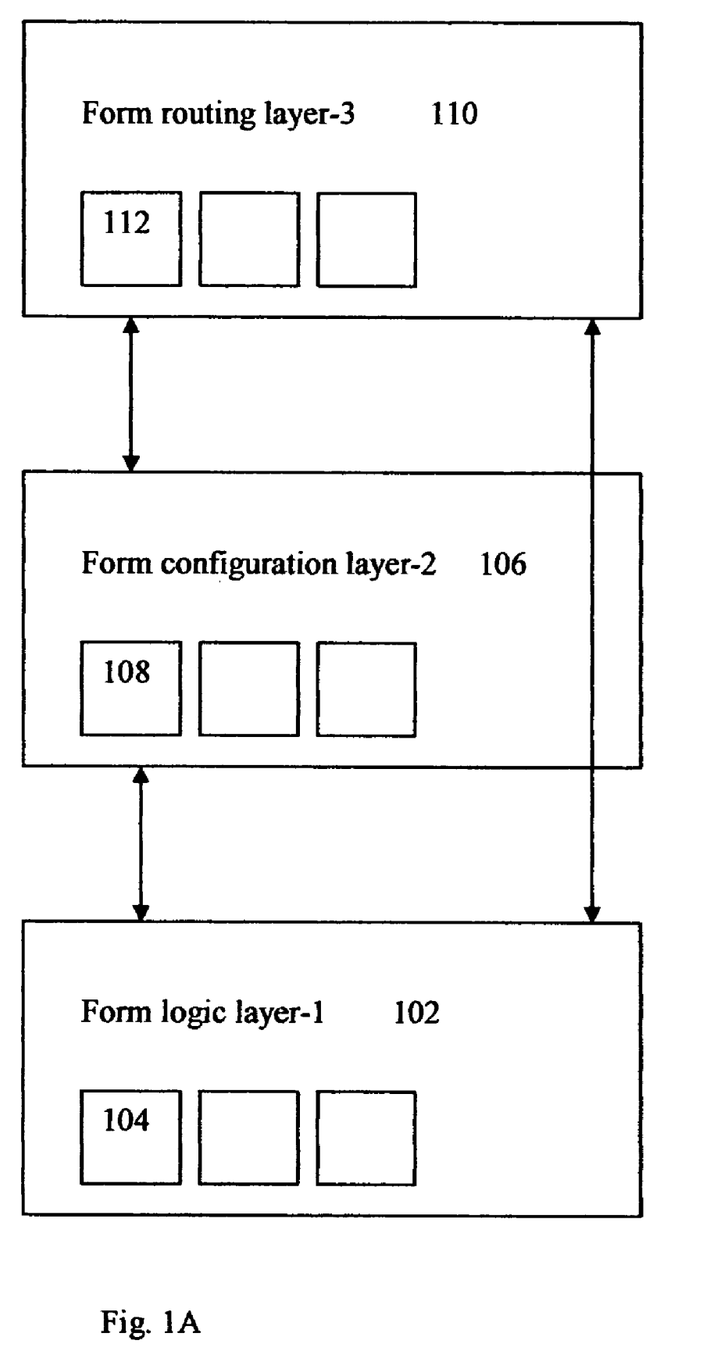
FIGS. 1A–1D shows various embodiments of a process for forming a three-dimensional (3D) IC.

FIG. 1A shows a process for fabricating a first embodiment of an integrated circuit The process allows the user to specify whether the IC is an FPGA or an ASIC. The process 100 forms a three-dimensional semiconductor device. The process 100 includes forming a first module layer 102 with a plurality of circuit blocks 104 embedded therein. The process 100 also includes forming a second module layer 106 substantially above the first module layer 102. One or more configuration circuits 108 are formed in 106 to store instructions to control a portion of the circuit blocks 104. The process 100 then forms wiring/routing circuits on a third module layer 110 above the second module layer 106. Module layer 110 has one or more circuits 112 connecting to both circuits 104 and 108 to complete the functionality of the PLD.

Figure 1B:
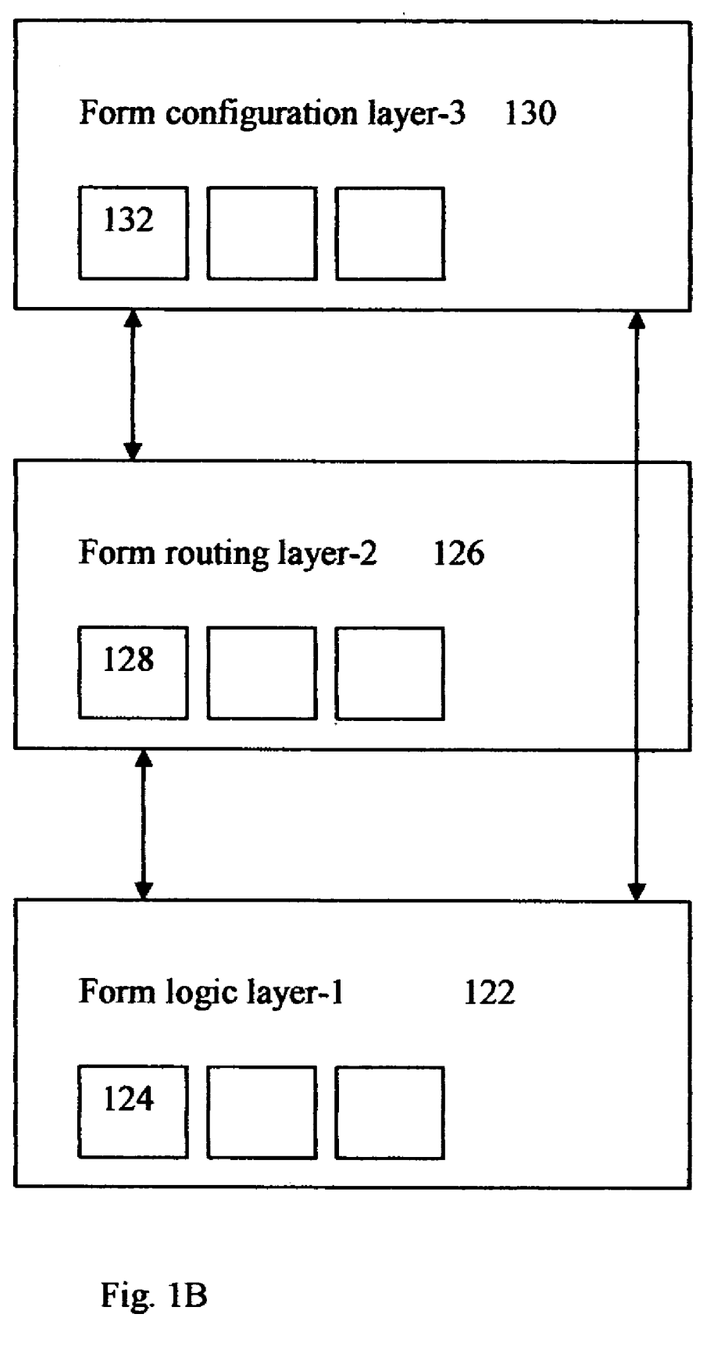

FIG. 1B shows a process 120 for fabricating a second embodiment of a 3D integrated circuit that can be either an FPGA or an ASIC. The process 120 includes forming a first module layer 122 having a plurality of circuit blocks 124 embedded therein. The process 120 also includes forming a second module layer 126 formed substantially above the first module layer 122 that includes wiring and/or routing circuitry 128. Next, the process 120 forms a third module layer 130 substantially above the second module layer 126 that includes configuration circuits 132. The wiring/routing circuitry 128 connects to the circuit blocks 124 and to configuration circuits 132. The configuration circuits 132 store instructions to control a portion of the circuit blocks 124.

Figure 1C:
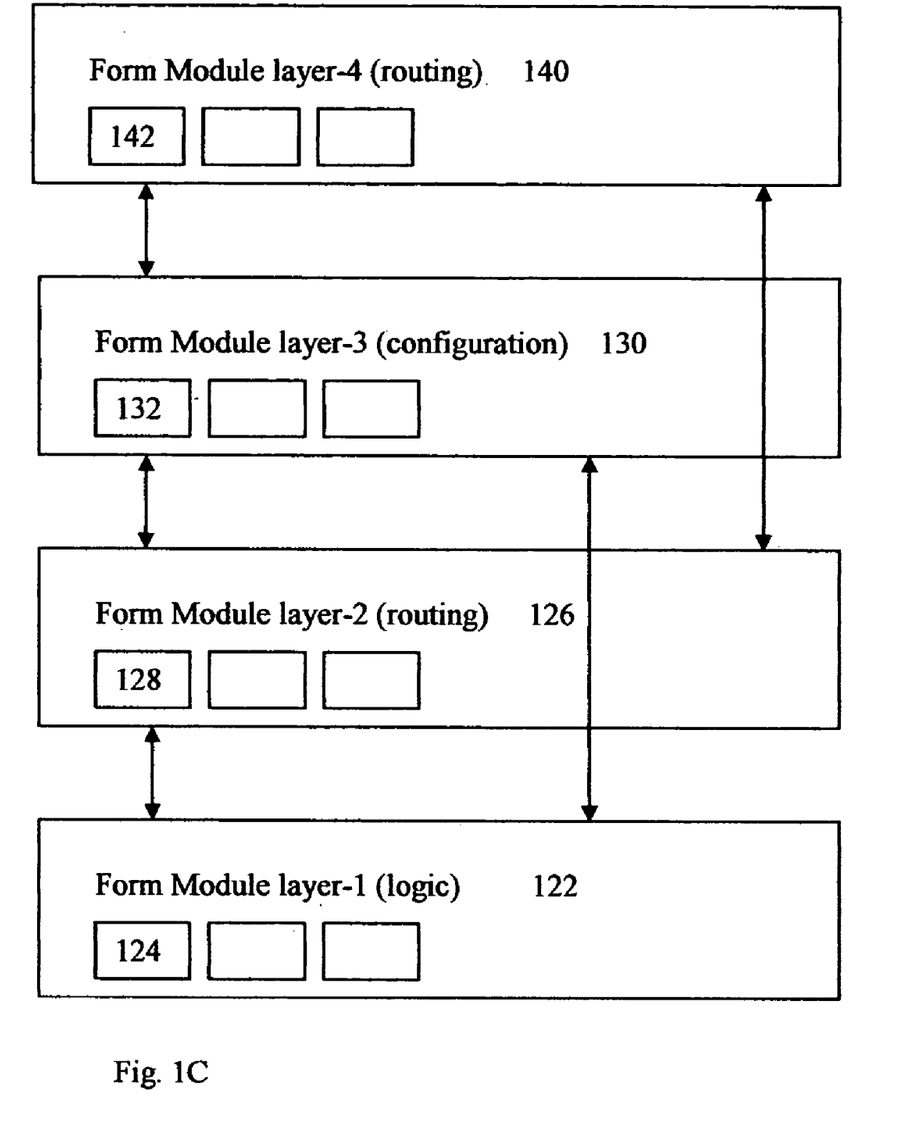

FIG. 1C shows a third process which extends the process shown in FIG. 1B. In the embodiment of FIG. 1C, the process deposits a fourth module layer 140 having wiring/routing circuitry 142 positioned above the third module layer 130. The wiring/routing circuitry 142 is electrically connected to one of the following: one or more circuit blocks 124, one or more wiring/routing circuitry 128, and one or more configuration circuits 132.

Figure 1D:
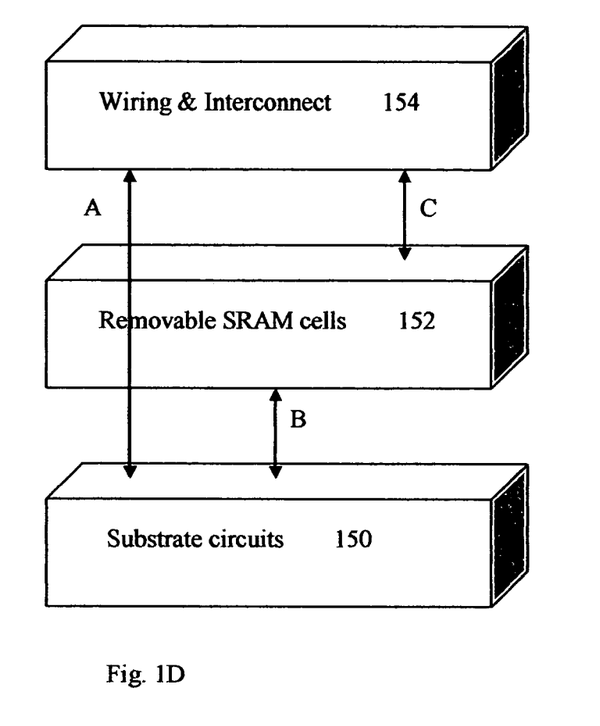

FIG. 1D shows one implementation where the configuration memory element is SRAM First, silicon transistors 150 are deposited on a substrate. A module layer of removable SRAM memory cells 152 are positioned above the silicon transistors 150, and a module layer of interconnect wiring or routing circuit 154 is formed above the removable memory cells 152. To allow this replacement, the design adheres to a hierarchical layout structure. As shown in FIG. 1D, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc (power) and Vss (ground) wires. Most of the replaceable programmable elements and its configuration wiring is in the "replaceable module" while all the devices and wiring for the end ASIC is outside the "replaceable module". In other embodiments, the replaceable module could exist between two metal layers or as the top most layer satisfying the same device and routing constraints.

Fabrication of the IC also follows a modularized device formation. Formation of transistors 150 and routing 154 is by utilizing a standard logic process flow used in the ASIC fabrication. Extra processing steps used for memory element 152 formation are inserted into the logic flow after circuit layer 150 is constructed.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the co-pending incorporated by reference applications discussed above.

In FIG. 1D, the third module layer is formed substantially above the first and second module layers, wherein interconnect and routing signals are formed to connect the circuit modules within the first and second module layers. Alternatively, the third module layer can be formed substantially below the first and second module layer with interconnect and routing signals formed to connect the circuit modules within the first and second module layers. Alternatively, the third and fourth module layers positioned above and below the second module layer respectively, wherein the third and fourth module layers provide interconnect and routing signals to connect the circuit modules within the first and second module layers.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed to store instructions to control a portion of the circuit modules.

Figure 2:
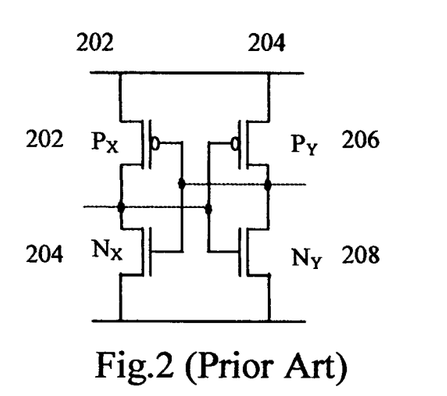
FIG. 2 shows an exemplary CMOS latch
Figure 3:
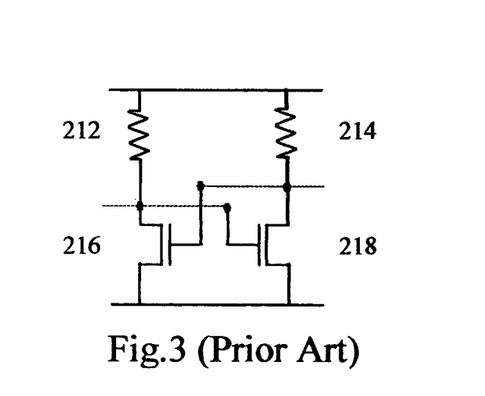
FIG. 3 shows one embodiment of a resistive load (R-load) latch.

FIG. 2 shows an embodiment of a CMOS latch fabricated using poly silicon thin film transistors (TFTs) 202, 204, 206 and 208, while FIG. 3 shows an exemplary R-load latch implemented with poly-silicon (poly) resistors 212 and 214, and NMOS TFTs 216 and 218. Depending on the application desired, data access transistors may be both made as TFT, mixed, or in single crystal silicon. Such TFT design eliminates the single crystal silicon area otherwise occupied by the SRAM cells. The two major disadvantages that make full TFT CMOS scheme unattractive today are: (i) highly varying drive currents of SRAM cells that prevent fast consistent access times, (ii) complexity and cost of the extra poly, implant and masking layers needed for CMOS TFT. The application is targeted towards PLD's and subsequent ASIC (Application Specific Integrated Circuit) applications where these two inhibitors are not limitations as shown next.

Figure 4:
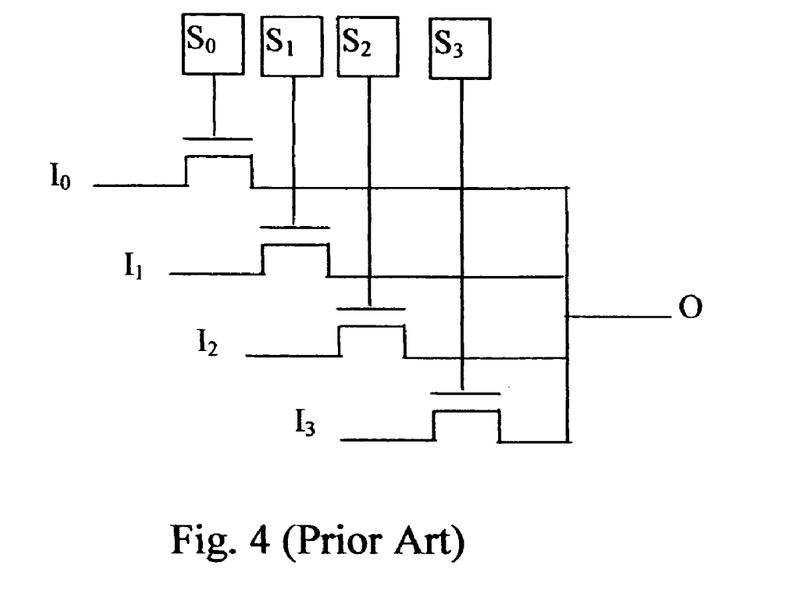
FIG. 4 shows an exemplary 4:1 MUX using NMOS pass gate logic.

In PLDs the SRAM latch data controls logic. The output of the latch drives high impedance gates of transistors with no transient SRAM switching. In the four-input MUX shown in FIG. 4, the outputs of 4 SRAM cells S0, S1, S2, & S3 map output O to one of 4 inputs, I0, I1, I2 & I3. The SRAMs only need to hold the logic levels 0 & 1 on NMOS gates and have no stringent requirements on the consistency of drive current strengths from cell to cell. For a PLD conversion to ASIC, after the logic pattern is finalized and permanent SRAM data is frozen, the SRAM module is replaced with a hard-wire module. This technology provides a frame work for modular substitution to make PLDs for prototyping and low volume production, and ASICs for high volume production. Such simplification allows replacing complex TFT processing with simple metal contacts or wire processing. When the TFT module is replaced by hard wires connected to power or ground the drive current is no longer an issue. Prototyping IC's consists of programmable TFT SRAM module, and the production volume IC's consists of metal module, eliminating the reasons not to use TFT SRAM cells. Thus, high density, low cost PLD & ASIC designs can be done as taught herein.

The following terms used herein are acronyms associated with certain manufacturing processes. The acronyms and their abbreviations are as follows:

Vt Threshold voltage
LDN Lightly doped NMOS drain
LDP Lightly doped PMOS drain
LDD Lightly doped drain
RTA Rapid thermal annealing
Ni Nickel
Ti Titanium
TiN Titanium-Nitride
W Tungsten
S Source
D Drain
G Gate
ILD Inter layer dielectric
C1 Contact-1
M1 Metal-1
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
LPCVD Low pressure chemical vapor deposition
CVD Chemical vapor deposition
ONO Oxide-nitride-oxide
LTO Low temperature oxide The TFT process technology consists of creating NMOS & PMOS poly-silicon (poly) transistor module. The process sequence can be inserted to any standard logic process flow. In one embodiment, after the gate poly of single crystal transistors are constructed, and the ILD film is deposited, prior to contact mask, this sequence can be inserted. In another embodiment, after M1 mask is defined, and the ILD is deposited, prior to VI mask, this sequence can be inserted. In the third preferred embodiment, the process sequence is introduced after contact-1 mask, and after contacts are formed, before depositing M1.

After gate poly of regular transistors are patterned and etched, the poly is salicided using Nickel & RTA sequences. Then the ILD is deposited, and polished by CMP techniques to a desired thickness. In this embodiment, the contact mask is split into two levels. The first contact-1 (C1) mask contains all contacts used for substrate Si Gate, Source, Drain and Well connections. Then the C1 mask is used to open and etch contacts in the ILD film. Standard plug contact process is used to deposit Ti/TiN & W, then CMP polished to leave W only in the contact holes. So far the processing is unchanged from standard logic process Contact formation schemes. In one embodiment, the logic processing steps described until now completes the module layer-1 described in FIG. 1. In another embodiment, the module layer-1 could include any number of metal and via combinations.

Figure 5:
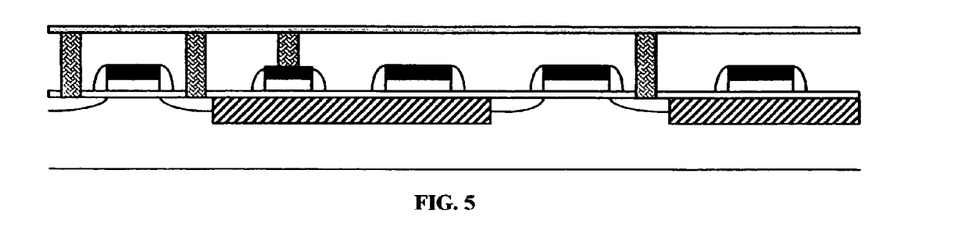
FIG. 5 shows a cross-sectional view of the 3D IC after a poly-1 (P1) film deposition process.

To construct the module layer-2, a first P1 poly layer, amorphous or crystalline, is deposited by LPCVD to a desired thickness above module layer-1. This is shown in FIG. 5 with P1 film deposition (after C1 formation in Logic process). P1 is used for the channel, source, drain regions for, both NMOS and PMOS TFT's, and to form pedestals to cover all through contacts going to upper metal layer.

Figure 6:
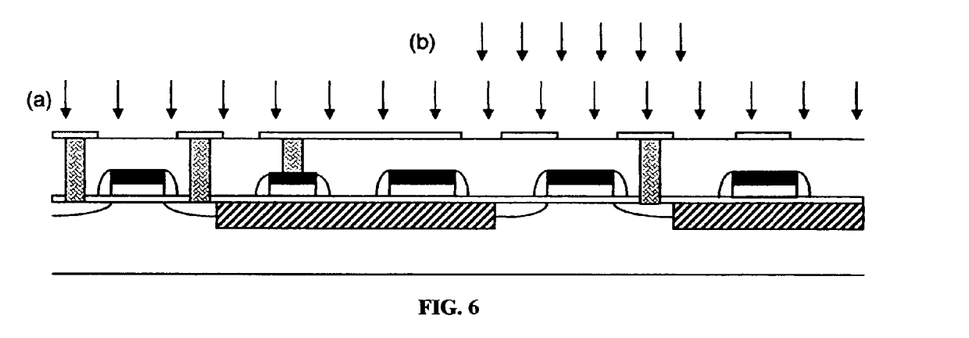
FIG. 6 shows a cross-sectional view of the 3D IC after a P1 etch process.

P1 is patterned and etched to form the transistor body regions and contact pedestals as shown in FIG. 6. After the P1 etch, transistor threshold implants are performed. In a first embodiment, NMOS transistors are mask selected with VTN mask and implanted with P– doping. PMOS transistor regions are selected with the reverse VTN mask and implanted with N– doping. In a second preferred embodiment the entire P1 is blanket implanted with P– doping, and the PMOS transistors are mask selected with VTP mask and implanted with N– doping to counter dope the previous P– implant. The preferred embodiment blanket P– and masked N– implants are shown in FIG. 6. The implant doses and P1 thickness are optimized to get the required threshold voltages for PMOS & NMOS devices under fully depleted transistor operation, and maximize on/off device current ratio. In yet another embodiment, both NMOS and PMOS body regions are undoped, and P1 remains as deposited. In this embodiment, the P1 thickness, gate dielectric thickness and gate material work-function are optimized to maintain transistor on/off conditions. The pedestals implant type is irrelevant at this point as it gets doped later in the process. In preferred embodiment, the order of the implants may be reversed, using a blanket N– implant first followed by a masked P– implant. The blanket doping can also be done in-situ during poly deposition to reduce processing steps.

Patterned and implanted P1 is subjected to dopant activation and crystallization. In one embodiment, amorphous poly is crystallized prior to P1 patterning with an oxide cap, metal seed mask, Ni deposition and MILC (Metal-Induced-Lateral-Crystallization). In another embodiment, an RTA cycle is used to activate & crystallize the poly after P1 implants to near single crystal form. In yet another preferred embodiment the P1 layer is left in its deposited state.

Then the TFT gate dielectric layer is deposited by CVD techniques to a desired thickness in the 20–200 Å range, desirably 40 Å in thickness. This gate material could be an oxide, nitride, oxynitride, ONO structure, or any other dielectric material combination used as gate dielectric. The dielectric thickness is determined by the voltage level of the process and NMOS and PMOS device parameters. Then a buried contact mask (BC) is used to etch areas where P1 contacts P2 layer. The BC mask allows for smaller SRAM cell size, and may be avoided. In another embodiment, P1 maybe re-crystallized to near single crystal formation by Ni deposition, either MILC or RTA for contact hole salicidization anneal, and then excess Ni etch-off. In a preferred embodiment, no recrystallization is done after BC mask etch.

Figure 7:
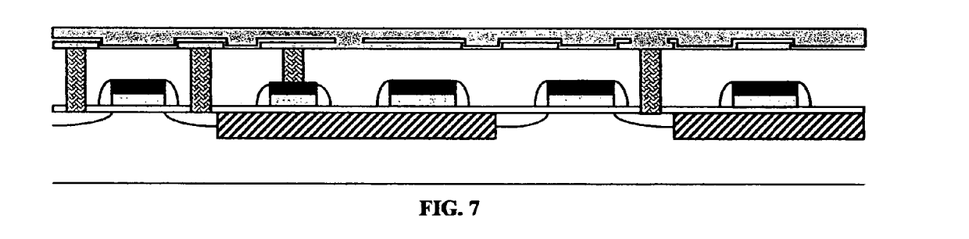
FIG. 7 shows a cross-sectional view of the 3D IC after a gate oxide deposition process.

Then second poly P2 layer, 500 Å to 2000 Å thick, is deposited as amorphous or crystalline poly-silicon by LPCVD. FIG. 7 shows the gate oxide (Gox) deposition, followed by a buried contact mask and P2 deposition. P2 contacts P1 in the BC areas are shown in FIG. 7, and are separated by the gate dielectric elsewhere.

Figure 8:
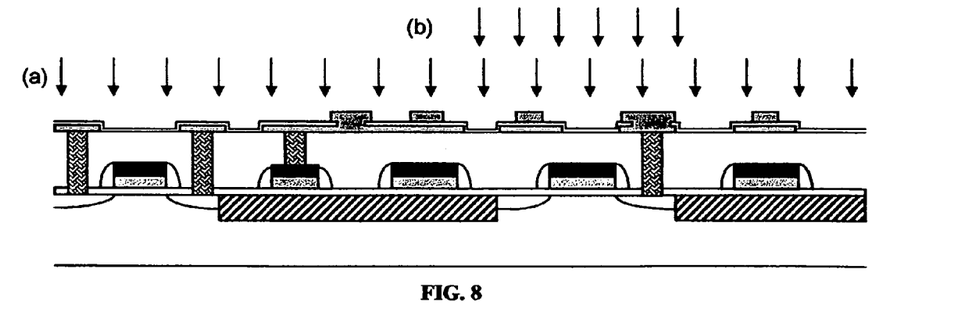
FIG. 8 shows a cross-sectional view of the 3D IC after a poly-2 (P2) mask and etch process.

A P2 mask is used to pattern and etch P2 into NMOS & PMOS gate regions, optional C1 pedestals, and interconnect lines as shown in FIG. 8. The P2 layer etching is continued until the dielectric oxide is exposed on P1 areas uncovered by P2 as shown in FIG. 8. After the P2 mask and etch, transistor tip implants are performed. In a preferred embodiment, shown in FIG. 8, a blanket NMOS LDN tip implant N–, followed by a masked PMOS LDP P– tip implant is used. In another embodiment, LDN mask and reverse polarity LDP masks are used for the two tip implants. In a third embodiment, no LDD tip implant is needed for the transistors.

Figure 9:
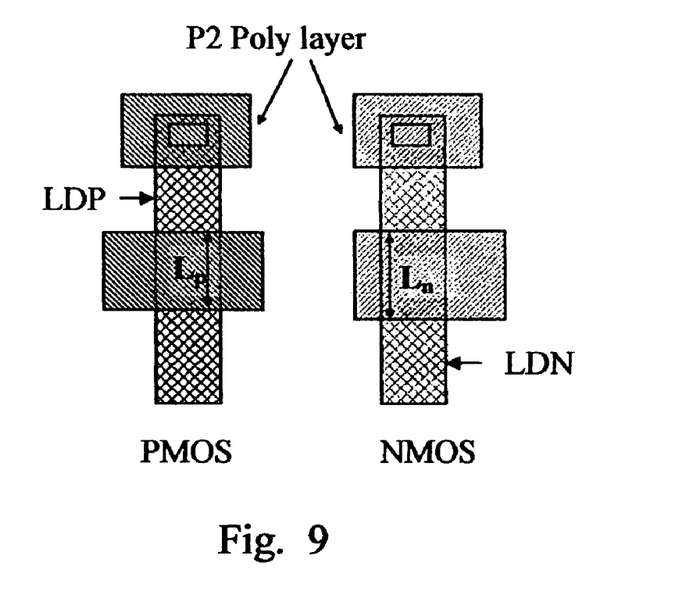
FIG. 9 shows a top view of P1 and P2 geometries after the P2 etch.

A top view of P1 and P2 geometries after the P2 etch are shown in FIG. 9. The source & drain P1 regions orthogonal to P2 gate regions are now self aligned to P2 gate edges. The S/D P2 regions may or may not contact P1 through buried contacts. Transistor width is determined by P1 width, while the transistor length is determined by P2 width. These devices are three terminal devices consisting of P2 gate terminal and P1 source and drain terminals.

Figure 10:
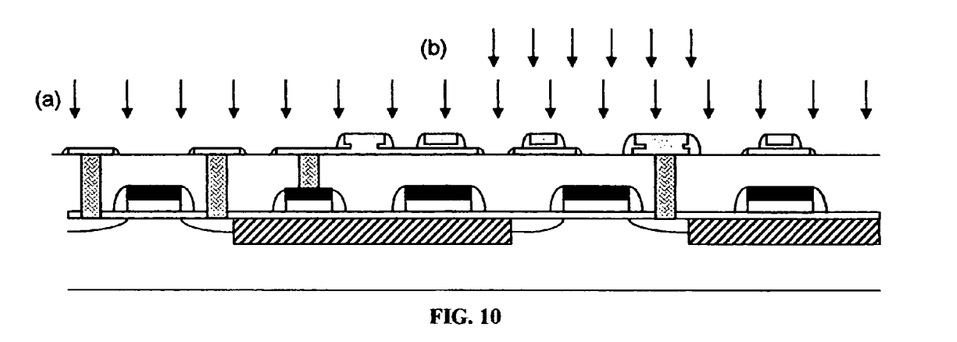
FIG. 10 shows a cross-sectional view of the 3D IC after a spacer LTO deposition/etch process.

A spacer oxide is deposited by LPCVD techniques, and etched to form spacers on the edges of exposed P2 and P1 regions as shown in FIG. 10. First, a spacer LTO deposition step and a spacer etch step is done. Next, a blanket N+ implant step is done, followed by a P+ mask & P+ implant, as detailed next.

In FIG. 10 the spacer etching is continued until P1 and P2 layers are fully exposed This facilitates the salicide formation of exposed P1 and P2 in a later step. In another embodiment, the spacer etch is stopped after the P2 spacer is formed & P2 regions are exposed, but before the gate oxide shown in FIG. 8 above P1 is etched. In that embodiment, only P2 forms a salicide at a later step. In the shown preferred embodiment in FIG. 10, blanket NMOS N+ implant, followed by a masked PMOS P+implant are used to dope source, drain, gate and interconnect regions. The P+ implant dose is greater than 1.5 times the N+ dose to counter-dope the PMOS regions. In another embodiment, separate N+ and P+ masks are used for the two implants to eliminate counter doping and minimize salicide peeling. Contact pedestal P1, and P1-BC-P2 stack can be doped N+ or P+ during this step. In FIG. 10, both P1 pedestals on the left are shown N+ doped, while P1-BC-P2 pedestal on the right is shown getting P+ dopant. On P2-BC-P1 stacks, the buried contact BC ensures full dopant penetration from P2 to P1 during subsequent anneal steps. When P1 areas are not exposed and covered by about 40 Å oxide after spacer etch, the implant energy ensures full or partial dopant penetration through the residual oxide in the S/D regions adjacent to P2. The presence of residual oxide between P1 gate regions and P1 S/D regions allow formation of self aligned LDD structures to optimize transistor performance by energy manipulation of the N+/P+ implants with no extra masks and processing. As shown in FIG. 10, the P– & N– implanted P1 regions are now completely covered by P2 layer, and form channel regions of NMOS & PMOS transistors respectively.

Figure 11:
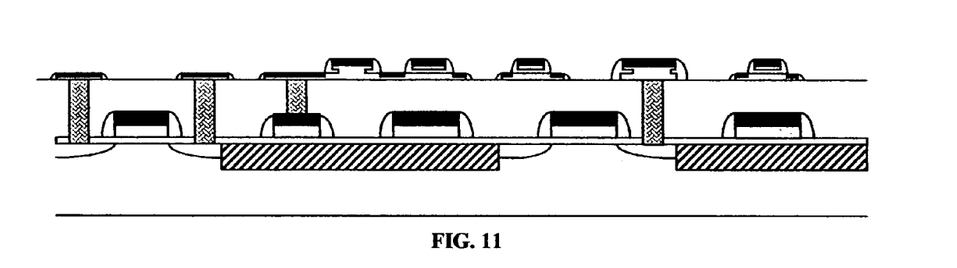
FIG. 11 shows a cross-sectional view of the 3D IC after a nickel deposition process.

After the P+/N+ implants, Nickel (Ni) is deposited over poly-2 and poly-1 and salicided to form a low resistive refractive metal on exposed poly by RTA. In another embodiment, Cobalt is used to form the salicide. Un-reacted Ni is etched after salicidation as shown in FIG. 11. After the Ni deposition, RTA Ni salicidation and RTA P1/P2 recrystallization are performed simultaneously before excess Ni is etched away (P1 & P2 salicided). The thickness of Ni is chosen to optimize the resistances in the TFT module. In the shown embodiment in FIG. 11, not all P1 is consumed by the salicide, and the same thickness of salicide is formed on P1 and P2. In another embodiment, all of P1 may be salicided to further reduce Source and Drain resistance of transistors, while obtaining even a thicker salicide on P2 to lower interconnect resistance. Nickel-salicide will electrically bridge the opposite doped poly-1 or poly-2 regions together and provide low resistive poly wires. In the embodiment with residual gate dielectric after P2 etch, P1 layer is not salicided in the LDD regions. P1-BC-P2 stacks are used for N+ and P+ source, drain regions when P1 is not salicided. The RTA anneal and salicidation step may be used to re-crystallize both P1 and P2 for the embodiment where prior crystallization was omitted In another embodiment, a laser anneal may be used to combine salicidation and re-crystallization in a single step. A single crystal silicon formation on P1 channel regions for NMOS and PMOS is desirable, but not a necessity, to enhance devices electrical performance.

An LTO film is deposited over P2 layer, and polished flat with CMP. A second contact mask C2 is used to open contacts into the TFT P2 regions (G/S/D contacts) in addition to all of the C1 pedestals from the first C1 mask. Some of the C1 contacts connect to outputs of TFT SRAM cells and need no C2 layer contacts. Contact plugs are filled with tungsten and CMP polished as shown in FIG. 12.

Figure 12:
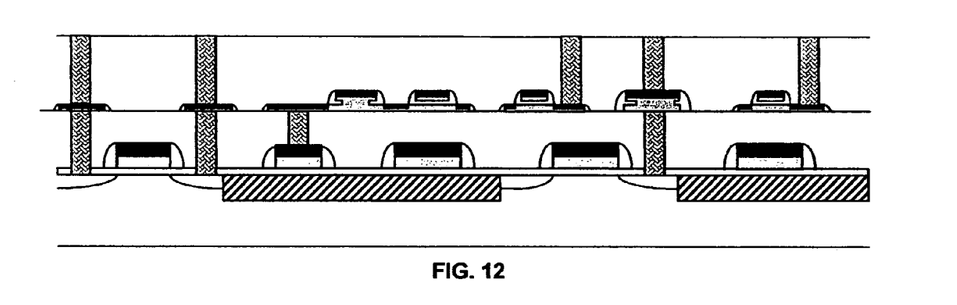
FIG. 12 shows a cross-sectional view of the 3D IC after an ILD LTO deposition and CMP process.

Steps comprising from P1 layer deposition in FIG. 5 through CMP polish step in FIG. 12 constitute module layer-2 formation described in FIG. 1. Standard metallization with multiple metal layers complete the formation of the IC. That back-end metal module is denoted module layer-3 in FIG. 1.

In FIG. 12, the three C1/C2 stack contacts show through connections between module layer-1 and module layer-3 described in FIG. 1. The first two use salicided P1 pedestals, while the third shows P1-BC-P2 stack pedestal for C2 contacts. Such a stack with no C2 contact can be used as source, drain regions for TFT transistors. The third C1 contact from the left show module layer-2 coupled to module layer-1 in FIG. 1 to provide control signals for logic modules. Third and fifth C2s from the left of FIG. 12 show module layer-2 to module layer-3 connections.

Figure 13:
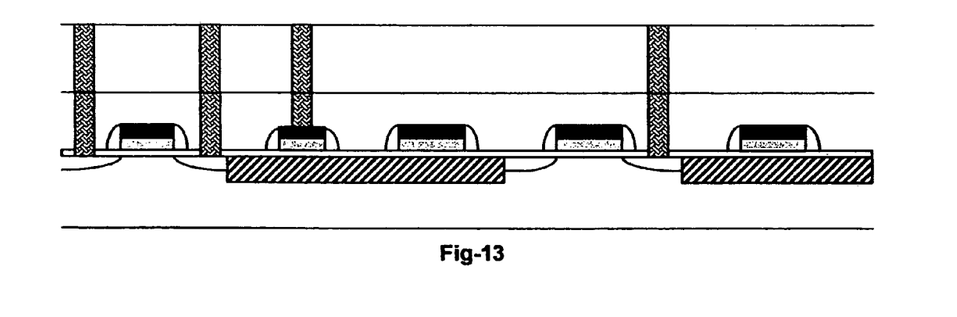
FIG. 13 shows a cross-sectional view of the 3D IC after a hardwired mask is used to replace a thin film transistor (TFT) module.

The TFT module of FIG. 12 is replaced by a hardwire mask, as shown in FIG. 13. A comparison between FIG. 12 and FIG. 13 show only C2 contacts change during the customization. No TFT module contacts are needed in FIG. 13, while previous TFT contacts C1 controlling logic are now extended by new C2 contacts to Vcc or Vss. In the shown embodiment in FIG. 13, only one C2 mask is customized to form the ASIC, provided M1 Vcc & Vss wires are available to connect to new C2. In another embodiment, the C1 and C2 masks in FIG. 13 are combined to form one C1 contact mask merging module layer-2 with module layer-1. In yet another embodiment, C1 mask in module layer-1 and M1 layer in module layer-3 are customized to form a two custom mask ASIC. In this case, M1 (not shown) layer is used to provide Vcc and Vss wires to the new C1 contacts that control logic gates in module layer-1.

Figure 14:
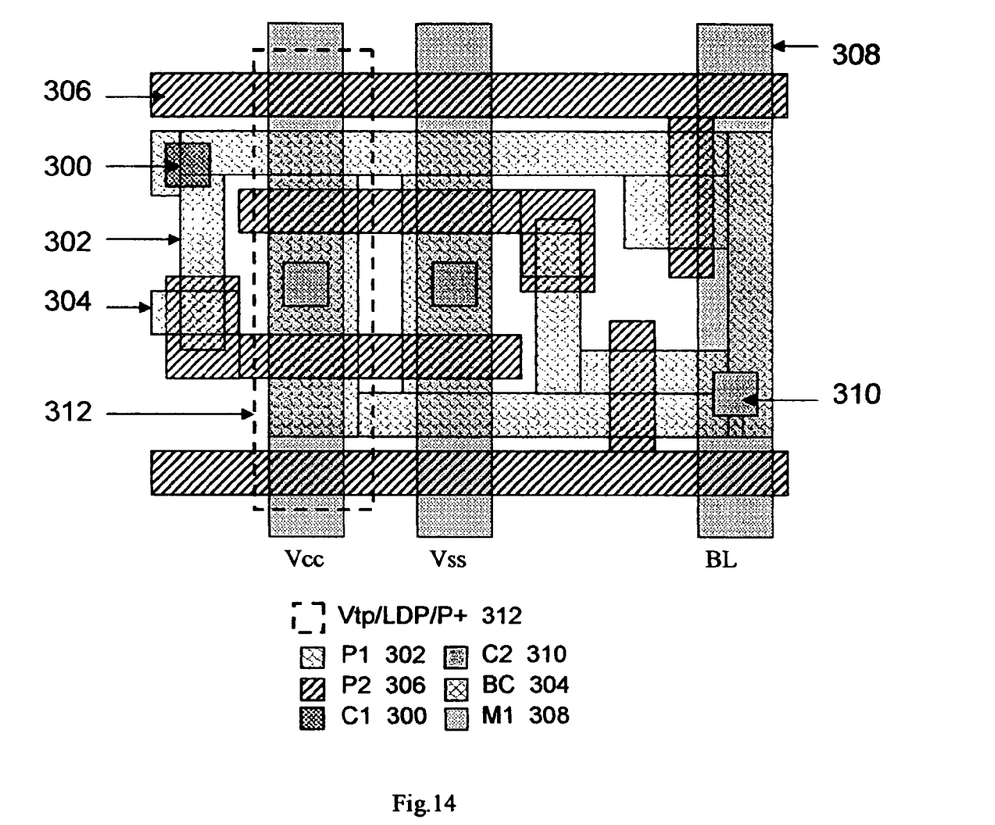
FIG. 14 shows an exemplary layout of a six transistor (6T) TFT SRAM cell.

An exemplary layout of a 6T SRAM cell is shown in FIG. 14 with all six transistors in P1, P2 layers. In another embodiment, the access NMOS transistors are in substrate silicon The element numbers of FIG. 14 are summarized for ease of reference:
  Bottom C1 contact 300
  Poly1 layer (P1) 302
  Buried P1-P2 contact (BC) 304
  Poly2 layer (P2) 306
  Upper metal layer 308
  Top contact (C2) 310
  Vtp, LDP & P+ implant layer 312

The P2 layer shown in FIG. 14 is fully salicided. P1 regions outside P2 and P2 spacer are also salicided in the preferred embodiment. P1 regions under P2 layer form the body of NMOS and PMOS transistors, are doped P– and N– respectively, and are not salicided P1 regions enclosed by dash line 312 are implanted N–, while P1 regions outside are implanted P–. PMOS gates and interconnect enclosed by dash line 312 are P+ implanted, while NMOS gates and interconnects outside 312 are N+ implanted. P2 carry GA & GB access signal lines required to write & clear data from SRAM cell. Two P1 to P2 buried contacts 304 are used to connect P1 to P2 without using upper metal and upper contacts. One lower contact C1 300 is the SRAM output contact driving a logic gate in module-1. BL data runs perpendicular to GA, and is done in an upper metal layer 308 as shown. A contact C2 310 is used to connect P1 to upper metal at the lower right corner in FIG. 14. Upper metal lines carrying Vcc and Vss connect to power and ground terminals of the latches via the two left C2 contacts. The same two Vcc and Vss lines are later used to convert C1 contact to a hardwire connection for the ASIC. In this embodiment, the BS line is same as BL line providing a single data path for write and clear functions. In another embodiment, BL & BS lines are separated to do independent write and clear functions. GB line is common to multiple transistors providing a global clear access. In this layout, with the exception of Vcc, Vss and BL signals, all others are kept in the TFT poly module. The current drive to write and clear SRAM is only required via BL line, and metal provides a very low resistance path for that function. Removal of TFT layers will eliminate all but BL SRAM related signal. Vcc & Vss lines are reused to provide the Vcc & Vss connected hard-wire option mask. Other variations of this layout can be constructed to achieve similar functionality.

One exemplary process sequence to fabricate the 3D FPGA IC is as follows:
Standard CMOS logic flow up to C1 mask as follows:
  P-type substrate
  Twin well
  Shallow Trench Isolation/CMP
  Sacrificial oxide
  PMOS Vt mask & implant
  NMOS Vt mask & implant
  Gate oxidation/Dual gate oxide option
  Gate poly (GP) deposition
  GP mask & etch
  LDN mask & implant
  LDP mask & implant
  Spacer oxide deposition & etch
  Ni deposition
  RTA anneal-Ni salicidation (S/D/G regions & interconnect)
  Unreacted Ni etch
  ILD oxide deposition & CMP
  C1 mask & etch
  W plug formation & CMP
Special TFT CMOS flow up to M1 deposition as follows:
  ~300 A a-P1 (amorphous poly-1) deposition
  P1 mask & etch
  Blanket Vtn P– implant (NMOS Vt)
  Vtp mask & N– implant (PMOS Vt)
  TFT Gox (40 A LTO) deposition
  Buried contact mask & etch
  500 A to 1000 A a-P2 deposition P2 mask & etch
LDN blanket N−NMOS tip implant
LDP mask and P−PMOS tip implant
Spacer LTO deposition
Spacer LTO etch to form spacers & expose P1
Blanket N+ implant (NMOS G/S/D & interconnect)
P+ mask & implant (PMOS G/S/D & interconnect)
Ni deposition
RTA salicidation and poly re-crystallization (G/S/D regions & interconnect)
Excess Ni etch
ILD oxide deposition & CMP
C2 mask & etch
W plug formation & CMP
M1 deposition and back end metallization During the customization, the base die and the data in those remaining mask layers do not change making the logistics associated with chip manufacture simple. Removal of the SRAM module provides a standard lower cost logic process for the final ASIC with the added benefit of the smaller die size. The design timing is unaffected by this migration as lateral metal routing and silicon transistors are untouched. Software and ASIC design methodology provide a guaranteed final ASIC solution to the user.

Thus, as discussed above, the third module layer containing M1 and back end metallization can be formed substantially above the first and second module layers, wherein interconnect and routing signals are formed to connect the circuit modules within the first and second module layers. Alternatively, the third module layer can be formed substantially below the first and second module layer with interconnect and routing signals formed to connect the circuit modules within the first and second module layers. This is made possible when multiple TFT modules may be formed and the first TFT module contains logic circuits. Alternatively, the third and fourth module layers positioned above and below the second module layer respectively, wherein the third and fourth module layers provide interconnect and routing signals to connect the circuit modules within the first and second module layers. This is made possible when the TFT module is inserted after first via above metal-1, prior to M2 deposition.

In yet another embodiment of a programmable multi-dimensional semiconductor device, a first module layer is fabricated having a plurality of circuit blocks formed on a first plane. The programmable multidimensional semiconductor device also includes a second module layer formed on a second plane. A plurality of configuration circuits is then formed to store instructions to control a portion of the circuit modules.

A full disclosure of the digital and configuration modules using a 3D structure is in the co-pending incorporated by reference applications discussed above. It is summarized here to provide a short overview. The circuit blocks can be a variety of digital or analog circuits. In one embodiment, programmable logic blocks are provided to respond to input data signals. The programmable logic blocks develop corresponding complete or partial output logic signals. Registers are used to store the sequential logic signals and either outputting them to output terminals or returning them as inputs to additional programmable logic blocks. Registers may be programmed out for combinational logic, or modified from JK flip-flops to T-flip flops. The programmable logic block can be selected from one of a pass gate logic, a multiplexer, a truth table logic, or an AND/OR logic. In yet other embodiments, the circuit block contains a RAM/ROM logic block consisting of "logic element tree" or "P-Term logic array" blocks that perform logic functions. In another embodiment, the logic block may be a "logic element" constructed by combining one or more of pass-gate, MUX, truth table, register, and AND/OR array elements.

In another embodiment, the programmable logic block can be a programmable microprocessor block. The microprocessor can be selected from third party IP cores such as: 8051, Z80, 68000, MIPS, ARM, and PowerPC. These microprocessor architectures include superscalar, Fine Grain Multi-Threading (FGMT) and Simultaneous Multi-Threading (SMT) that support Application Specific Packet Processing (ASPP) routines. The processor can contain hardware and software configurability. Programmable features can include varying processor speed, cache memory system and processor configuration, enhancing the degree of Instruction Level Parallelism (ILP), enhancing Thread level parallelism (TLP) and cache partitioning. The processor block can be a Very Long Instruction Word (VLIW) processor to handle multimedia applications and include a cache controller to mange cache allocation.

The programmable logic block can also contain a digital signal processor (DSP), designed to optimize performance for very high speed applications in wireless and fiber-optic networks. The DSP applications can include programmable content for cache partitioning, digital filters, image processing and speech recognition blocks. These real-time DSP applications contain high interrupt rates and intensive numeric computations best handled by hardware blocks. In addition, the applications tend to be intensive in memory access operations, which may require the input and output of large quantities of data. The DSP cache memory may be configured to have "Harvard" or "Modified Harvard" architectures with programmable data memories.

In another embodiment, programmable logic block can contain software programmability. These software functions are executed in DSP, ARM or MIPS type inserted IP cores, or an external host CPU. Accelerators connected by a configurable SRAM switching matrix enhance the computation power of the processors. The switch matrix is pre-designed to offer both hard-wire and programmable options in the final ASIC.

In yet another embodiment, programmable logic block can be memory such as a register file, cache memory, static memory, or dynamic memory. A register length counter may be programmable in the register file. The cache memory may be programmable to partition between the different requirements of the system design. The memory can also be static random access memory or (SRAM) device with an array of single port, or multi-port addressable memory cells. The memory can also be a smaller dynamic random access memory (DRAM), containing a DRAM controller for refresh and memory management.

In another embodiment, logic block can be an intellectual property ("IP") core, which is usable through licensing from other companies, or taken from prior designs. In core-based design, individual cores may be developed and verified independently as stand-alone modules, particularly when IP core is licensed from external design source. These functions are provided to the user as IP blocks as special hardware blocks or pre-configured programmable logic blocks. The hardware logic block insertion to any position in a logic sequence is done through the configurable logic matrix. These hardware logic blocks offer a significant gate count reduction on high gate count frequently used logic functions, and the user does not require generic "logic element" customization. In both cases, the user saves simulation time, minimize logic gate count, improve performance, reduce power consumption and reduce product cost with predefined IP blocks. The switch matrix is replaced by hard-wires in the final ASIC.

The logic block can be an array of programmable analog blocks. In one embodiment, the analog blocks include programmable PLL, DLL, ADC and DAC. In another embodiment, each block contains an operational amplifier, multiple programmable capacitors, and switching arrangements for connecting the capacitors in such as a way as to perform the desired function. Multiple PLL's can be programmed to run at different frequencies on the same chip to facilitate SoC applications requiring more than one clock frequency.

The circuit blocks 104 also contain data fetch and data write circuitry required to configure the configuration circuits 108. This operation may be executed by a host CPU residing in the system, or the PLD device itself. During power up, these circuits initialize and read the configuration data from an outside source, either in serial mode or in parallel mode. The data is stored in a predefined word length locally and written to the configurability allocation. The programmed configuration data is verified against the locally stored data and a programming error flag is generated if there is a mismatch. These circuits are redundant in the conversion of the PLD to an ASIC. However, these circuits are used in both FPGA and ASIC for test purposes, and has no cost penalty. A pin-out option has a "disable" feature to disconnect them for the customer use in the FPGA and ASIC.

Turning to the configuration circuits, one embodiment of the configuration circuit includes an array of memory elements. The user configuration of this memory amounts to a specific bitmap of the programmable memory in a software representation.

Suitable memory elements include volatile or non volatile memory elements. In non-volatile memory (NVM) based products, configurable data is held in one of metal link fuse, anti-fuse, EPROM, Flash, EEPROM memory element, or ferro-electric elements. The first two are one time programmable (OTP), while the last four can be programmed multiple times. As EPROM's require UV light to erase data, only Flash & EEPROM's lend to in-system programmability (ISP). In volatile products, the configurable data storage can be SRAM cells or DRAM cells. Additionally, one or more redundant memory cells controlling the same circuit block can be used to enhance device yield.

The components of the memory element array can be a resistor, capacitor, transistor or a diode. In another embodiment of the configuration circuit, a memory element can be formed using thin film deposition. The memory element can be a thin film resistor, thin film capacitor, thin film transistor (TFT) or a thin film diode or a group of thin film devices connected to form an SRAM cell.

This discussion is mostly on SRAM elements and can easily extend to include all other programmable elements. In all cases, the design needs to adhere to rules that allow programmable module elimination, with no changes to the base die, a concept not used in PLD, FPGA, Gate Array and ASIC products today.

The wiring and/or routing circuit connects each logic block to each other logic block. The wiring/routing circuit allows a high degree of routing flexibility per silicon area consumed and uniformly fast propagation of signals, including high-fanout signals, throughout the device.

One embodiment of a switch matrix is a programmable switch-matrix with SRAM bits, fuses or antifuses. During power-up, a permanent non-volatile memory block located in the system, loads the correct configuration data into SRAM cells. Another embodiment provides short interconnect segments that could be joined to each other and to input and output terminals of the logic blocks at programmable interconnection points. In another embodiment, direct connections to adjacent logic blocks can be used to increase speed. For global signals that traverse long distances, longer lines are used. Segmented interconnect structures with routing lines of varied lengths can be used. In yet other embodiments, a hierarchical interconnect structure provides lines of short lengths connectable at boundaries to lines of longer lengths extending between the boundaries, and larger boundaries with lines of even longer length extending between those boundaries. The routing circuit can connect adjacent logic blocks in two different hierarchical blocks differently than adjacent logic blocks in the same hierarchical block. Alternatively, a tile-based interconnect structure can be used where lines of varying lengths in which each tile in a rectangular array may be identical to each other tile. In yet another implementation, the interconnect lines can be separated from the logic block inputs by way of a routing matrix, which gives each interconnect line more flexible access to the logic block inputs.

As discussed above, the process can be modified to fabricate a generic field programmable gate array (FPGA) with the constructed memory circuit or an application specific integrated circuit (ASIC) with the constructed conductive pattern. Multiple ASICs can be fabricated with different variations of conductive patterns. The memory circuit and the conductive pattern have one or more substantially matching logic control characteristics. In this case, FPGA or ASIC timing characteristics are substantially unchanged by the logic control option. The process thus fabricates a programmable logic device by constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern have substantially matching timing characteristics.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A method of forming a semiconductor device, comprising:
   fabricating digital circuits comprising a programmable logic circuit on a substrate;
   selectively fabricating either a memory circuit or a conductive pattern substantially above the digital circuits to program said programmable logic circuit; and
   fabricating an interconnect and routing structure substantially above the digital circuits and memory circuits to connect digital circuits and one of the memory circuit or the conductive pattern;
   wherein the conductive pattern fabrication option utilizes a logic process sequence and the selective memory circuit fabrication option utilizes a thin-film transistor (TFT) process sequence inserted to said logic process sequence, wherein the logic process sequence further comprises:
forming a P-type substrate;
creating a twin well;
developing a shallow trench isolation;
performing a sacrificial oxide;
generating a PMOS Vt mask and implant;
generating a NMOS Vt mask and implant;
developing gate oxidation;
depositing gate poly (GP);
applying the GP mask and etch;
applying an LDN mask and implant;
applying an LDP mask and implant;
depositing a spacer oxide and etching the spacer oxide;
depositing Nickel; performing RTA anneal—Ni salicidation (S/DIG regions & interconnect) etching to remove unreacted Nickel;
depositing ILD oxide and performing CMP;
applying a C1 mask and etch;
forming a W plug and performing CMIP;
depositing M1;
applying a M1 mask & etch; and
performing back end metallization.

2. A method of forming a semiconductor device, comprising:
fabricating digital circuits comprising a programmable logic circuit on a substrate;
selectively fabricating either a memory circuit or a conductive pattern substantially above the digital circuits to program said programmable logic circuit; and
fabricating an interconnect and routing structure substantially above the digital circuits and memory circuits to connect digital circuits and one of the memory circuit or the conductive pattern;
wherein the conductive pattern fabrication option utilizes a logic process sequence and the selective memory circuit fabrication option utilizes a thin-film transistor (TFT) process sequence inserted to said logic process sequence, wherein the thin-film transistor (TFT) process sequence further comprises:
depositing amorphous poly-1 (P1);
performing P1 mask & etch;
applying NMOS Vt mask & P-implant;
applying PMOS Vt mask & N-implant; depositing Gox;
applying buried contact mask & etch;
depositing amorphous poly-2 (P2);
applying P2 mask & etch;
applying LDN mask & N-implant;
applying LDP mask & P-implant;
depositing Gox;
depositing a spacer oxide and etching the spacer oxide;
applying N+mask & implanting NMOS G/S/D;
applying P+mask & implanting PMOS G/S/D;
depositing Nickel;
salicidizing the Nickel on the G/SID regions & interconnect;
performing RTA anneal—P1 and P2 re-crystallization;
depositing ILD oxide & CMP;
applying C2 mask & etch; and
forming a W plug & CMIP.

3. A method to fabricate a monolithic programmable logic device, comprising:
constructing digital circuits comprising a programmable logic circuit on a substrate; and constructing a non-planar configuration circuit above the digital circuits to program said programmable circuit, said configuration circuit being:
either a memory circuit deposited to store configuration data to fabricate a field programmable gate array (FPGA) device, or a conductive pattern deposited to hard-wire configuration data to fabricate an application specific integrated circuit (ASIC) device;
wherein the FPGA and the ASIC have substantially matching timing characteristics; and
wherein constructing the configuration circuit is further comprised of constructing one of SRAM, DRAM, EEPROM, EPROM, Flash, ferro-electric, electro-magnetic, electro-chemical, fuse-link, anti-fuse capacitor, carbon filament, mask-programmable ROM or any other programmable memory element that can be configured to store a logic zero or a logic one.

4. The method of claim 3, wherein constructing the configuration conductive pattern is further comprised of constructing a mask-programmable read only memory comprising hard-wires connected to either a power-supply or a ground-supply to store a logic one or a logic zero respectively.

* * * * *